(12) United States Patent
Yang et al.

(10) Patent No.: US 6,362,051 B1
(45) Date of Patent: Mar. 26, 2002

(54) METHOD OF FORMING ONO FLASH MEMORY DEVICES USING LOW ENERGY NITROGEN IMPLANTATION

(75) Inventors: Jean Yang, Sunnyvale; Yider Wu; Hidehiko Shiraiwa, both of San Jose; Mark Ramsbey, Sunnyvale, all of CA (US)

(73) Assignees: Advanced Micro Devices, Inc., Sunnyvale, CA (US); Fujitsu Limited, Kanagawa (JP)

( * ) Notice: Subject to any disclaimer, the term of this patent is extended or adjusted under 35 U.S.C. 154(b) by 0 days.

(21) Appl. No.: 09/648,361

(22) Filed: Aug. 25, 2000

(51) Int. Cl.[7] ............................................. H01L 21/336
(52) U.S. Cl. ..................... 438/261; 438/444; 438/448; 438/585; 438/264; 438/239; 438/762
(58) Field of Search ................................. 438/261, 266, 438/238, 275, 239, 257, 258, 265, 659, 594, 267, 407, 264, 240

(56) References Cited

U.S. PATENT DOCUMENTS 5,880,008 A * 3/1999 Akiyama et al. ........... 438/444
6,127,227 A * 10/2000 Lin et al. .................... 438/261
6,165,846 A * 12/2000 Carns et al. ................. 438/264

* cited by examiner

Primary Examiner—Matthew Smith
Assistant Examiner—Igwe U. Anya
(74) Attorney, Agent, or Firm—Eschweiler & Associates, LLC

(57) ABSTRACT

A gate structure for an ONO flash memory device includes a first layer of silicon oxide on top of a semiconductor substrate, a second layer of silicon oxide, a layer of silicon nitride sandwiched between the two silicon oxide layers, and a control gate on top of the second layer of silicon oxide. Nitrogen is implanted into the first layer of silicon oxide at less than normal energy levels to reduce the amount of damage to the underlying semiconductor substrate. After low energy nitrogen implantation, the semiconductor structure is heated to anneal out the implant damage and to diffuse the implanted nitrogen to the substrate and silicon oxide interface to cause SiN bonds to be formed at that interface. The SiN bonds is desirable because they improve the bonding strength at the interface and the nitrogen remaining in the silicon oxide layer increases the oxide bulk reliability.

16 Claims, 9 Drawing Sheets

(OPTIONAL)

ically to an embodiment of the invention for forming a flash memory device having an ONO layer; and

METHOD OF FORMING ONO FLASH MEMORY DEVICES USING LOW ENERGY NITROGEN IMPLANTATION

BACKGROUND OF THE INVENTION

1. Field of the Invention

The invention relates generally to flash memory devices and more particularly to a method of fabricating flash memory devices having an ONO layer which contains a silicon nitride layer sandwiched between two silicon oxide layers.

2. Description of the Related Art

A flash memory having an ONO layer is illustrated in FIG. 1. It includes an ONO layer 60 disposed on top of a silicon substrate 10, and a control gate 71, typically of polysilicon, disposed on top of the ONO layer 60. The ONO layer 60 comprises a lower layer 61 made of silicon oxide, a middle layer 62 made of silicon nitride, and an upper layer 63 made of silicon oxide.

FIGS. 2A–2J illustrate the conventional process for fabricating a flash memory device having an ONO layer. First, a silicon oxide layer 20 is thermally grown on the silicon substrate 10 to form the structure of FIG. 2A. Then, as shown in FIG. 2B, nitrogen atoms (N or $N_2$) are implanted at normal energy levels (greater than or equal to 10 keV) into the silicon oxide layer 20. The nitrogen implanting step is followed by heating to anneal out the implant damage and to diffuse the implanted nitrogen to the $Si/SiO_2$ interface 21 and cause SiN bonds to be formed at the $Si/SiO_2$ interface 21.

Subsequently, a silicon nitride layer 30 is deposited on top of the silicon oxide layer 20 by chemical vapor deposition (CVD). FIG. 2C shows the silicon nitride layer 30 deposited on top of the silicon oxide layer 20. A second layer of silicon oxide 40 is then formed on top of the silicon nitride layer 30 and the resulting structure is shown in FIG. 2D. Thereafter, as shown in FIG. 2E, a photoresist 50 is formed on top of the second silicon oxide layer 40, and this semiconductor structure is etched until an upper surface of the silicon substrate 10 is exposed. The resulting structure, shown in FIG. 2F, is subsequently implanted with arsenic and boron ions using the remaining photoresist 50 as a mask and heated to diffuse the implanted ions.

The remaining photoresist 50 is stripped away and, as shown in FIG. 2G, a polysilicon layer 70 is deposited on top of the exposed surface of the silicon substrate 10 and on top and sidewalls of the ONO layer 60. The polysilicon layer 70 is then patterned using conventional lithography techniques and a control gate 71 remains on top of the ONO layer 60. FIG. 2H shows the resulting gate structure 75 including the control gate 71 and the ONO layer 60.

Oxide spacers 81, 82, shown in FIG. 2J, are formed on the sidewalls of the gate structure 75 by (i) depositing a conformal layer of silicon oxide 80 by CVD on the exposed surface of the silicon substrate 10 and on top and sidewalls of the gate structure 75 (FIG. 2I), and (ii) anisotropically etching the deposited silicon oxide.

SUMMARY OF THE INVENTION

The invention provides a process for forming an ONO flash memory device using low energy nitrogen implantation that reduces the damage to the underlying silicon substrate during implantation.

The invention produces a gate structure for an ONO flash memory device that includes a first layer of silicon oxide on top of a semiconductor substrate, a second layer of silicon oxide, a layer of silicon nitride sandwiched between the two silicon oxide layers, and a control gate on top of the second layer of silicon oxide. Nitrogen is implanted into the first layer of silicon oxide at less than normal energy levels to reduce the amount of damage to the underlying semiconductor substrate. After low energy nitrogen implantation, the semiconductor structure is heated to anneal out the implant damage and to diffuse the implanted nitrogen to the substrate and silicon oxide interface to cause SiN bonds to be formed at that interface. The SiN bonds is desirable because they improve the bonding strength at the interface and the nitrogen remaining in the silicon oxide layer increases the oxide bulk reliability.

Additional objects, features and advantages of the invention will be set forth in the description of preferred embodiments which follows.

BRIEF DESCRIPTION OF THE DRAWINGS

The invention is described in detail herein with reference to the drawings in which.

The accompanying drawings, which are incorporated in and constitute a part of the specification, illustrate presently preferred exemplary embodiments of the invention, and, together with the general description given above and the detailed description of the preferred embodiments given below, serve to explain the principles of the invention.

DETAILED DESCRIPTION OF THE PREFERRED EMBODIMENTS

Figure 1:
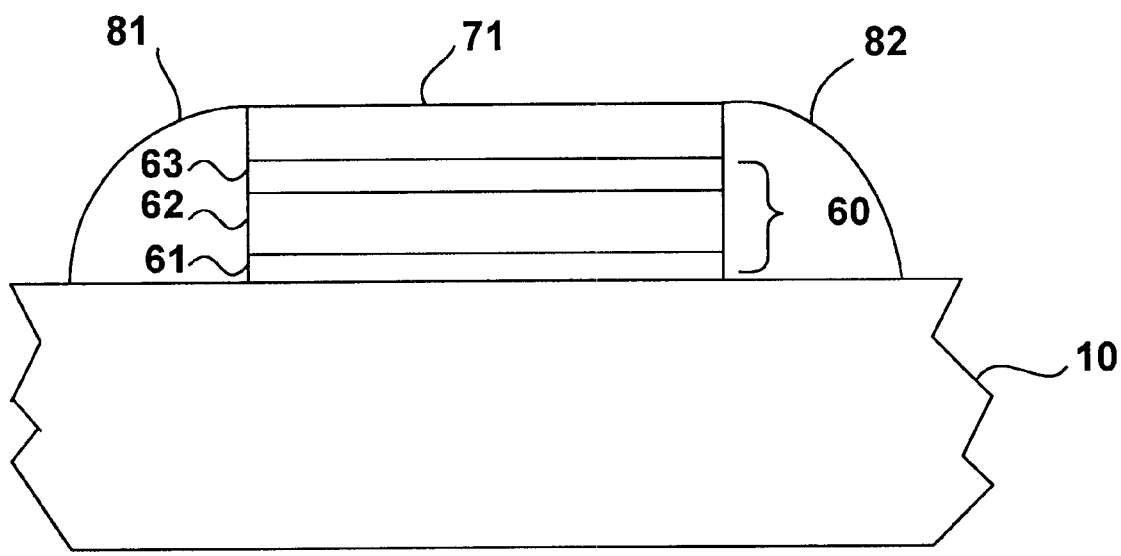
FIG. 1 illustrates in a cross section a flash memory device having an ONO layer.
Figure 2A:
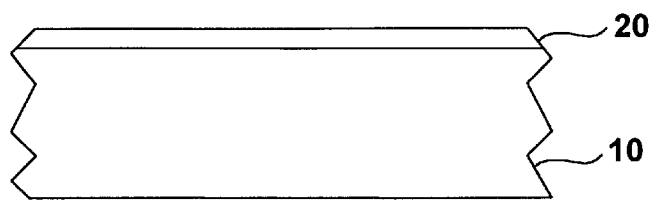
FIGS. 2A–2J illustrate the conventional process for forming a flash memory device having an ONO layer.
Figure 2B:
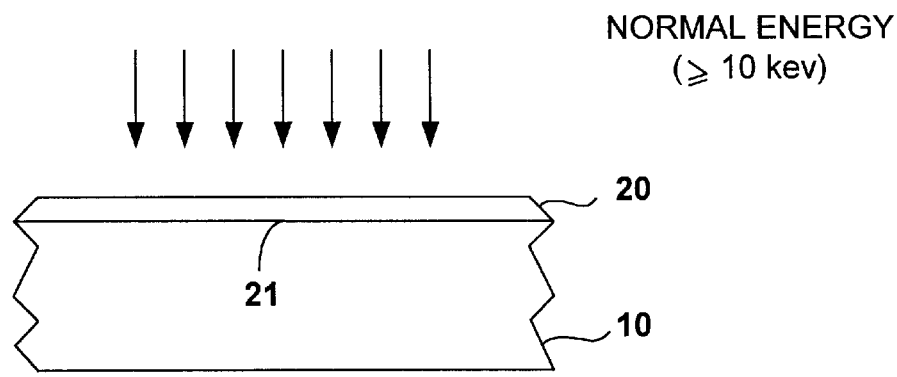
Figure 2C:
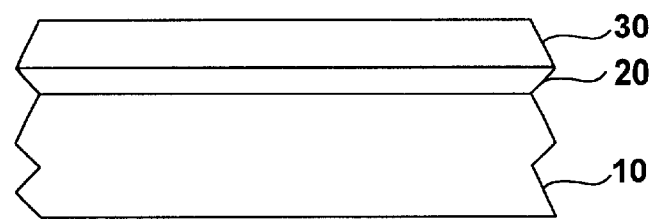
Figure 2D:
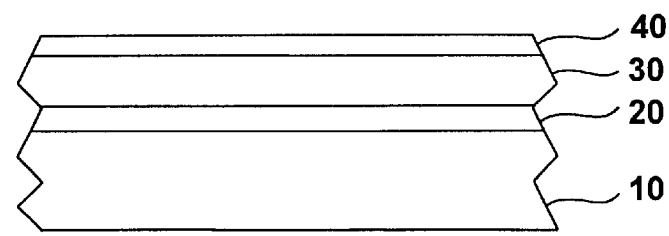
Figure 2E:
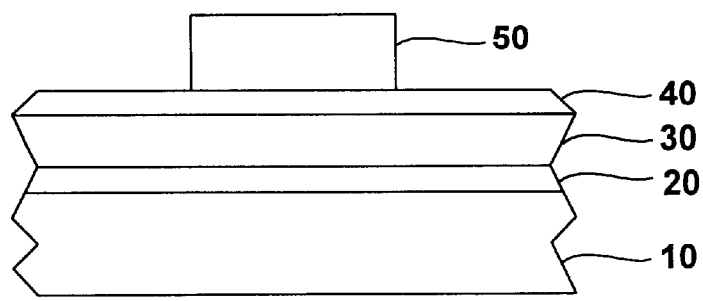
Figure 2F:
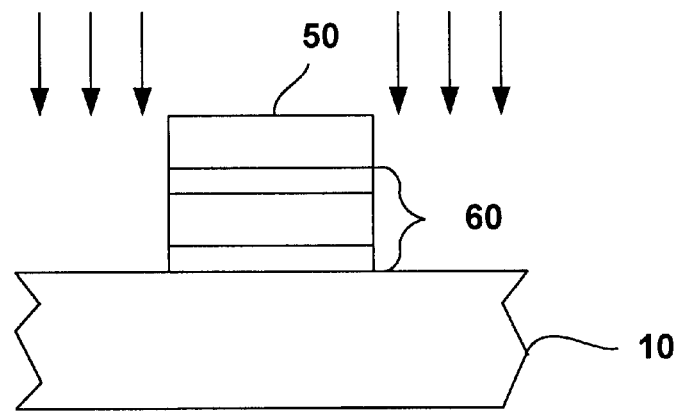
Figure 2G:
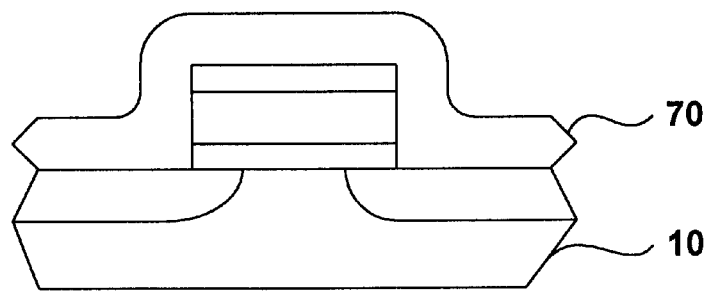
Figure 2H:
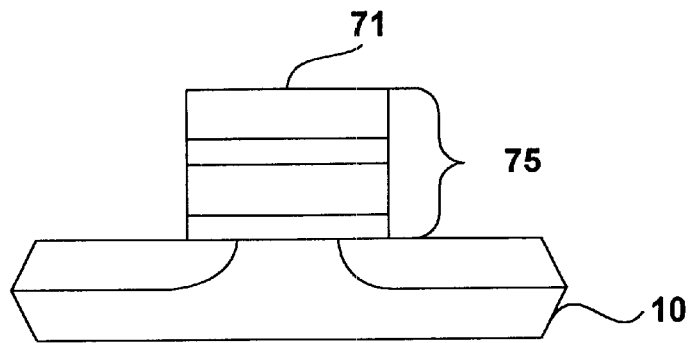
Figure 2I:
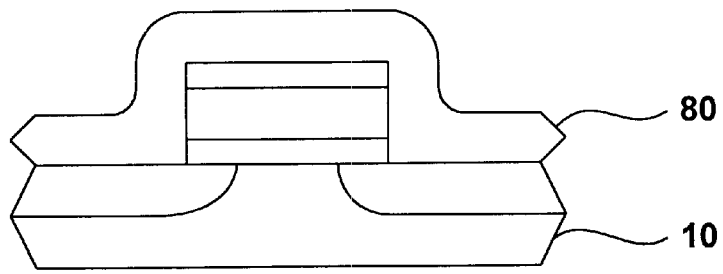
Figure 2J:
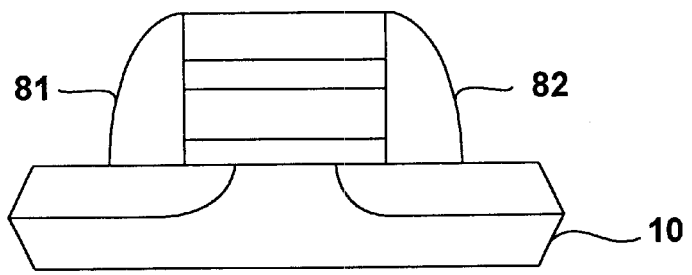
Figure 3A:
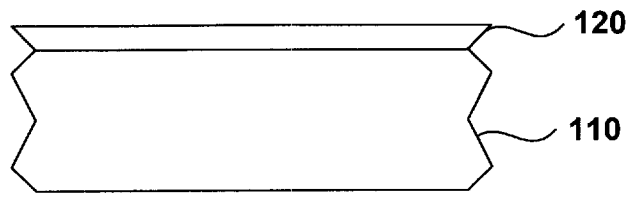
FIGS. 3A–3K illustrate the process according to an embodiment of the invention for forming a flash memory device having an ONO layer.

FIGS. 3A–3K illustrate the process according to an embodiment of the invention for fabricating a flash memory device having an ONO layer. First, as shown in FIG. 3A, a silicon oxide layer 120 is thermally grown on the silicon substrate 110 to a thickness of about 50–150 Å by heating the semiconductor substrate 110.

Figure 3B:
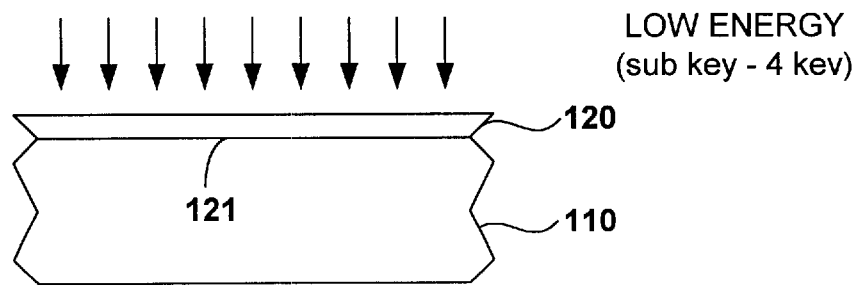
Figure 3C:
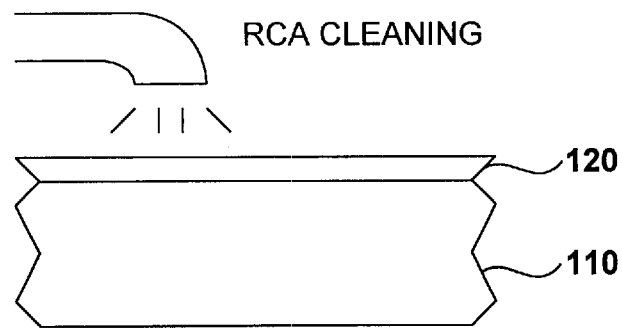

Then, as shown in FIG. 3B, nitrogen atoms (N or $N_2$) are implanted at less than normal energy levels, preferably in the range of sub keV energy level to 4 keV energy level, into the silicon oxide layer 120. The low energy implantation reduces the implant damage to the $Si/SiO_2$ interface while still getting enough nitrogen to the interface to form the SiN bonds at the interface.

Figure 4A:
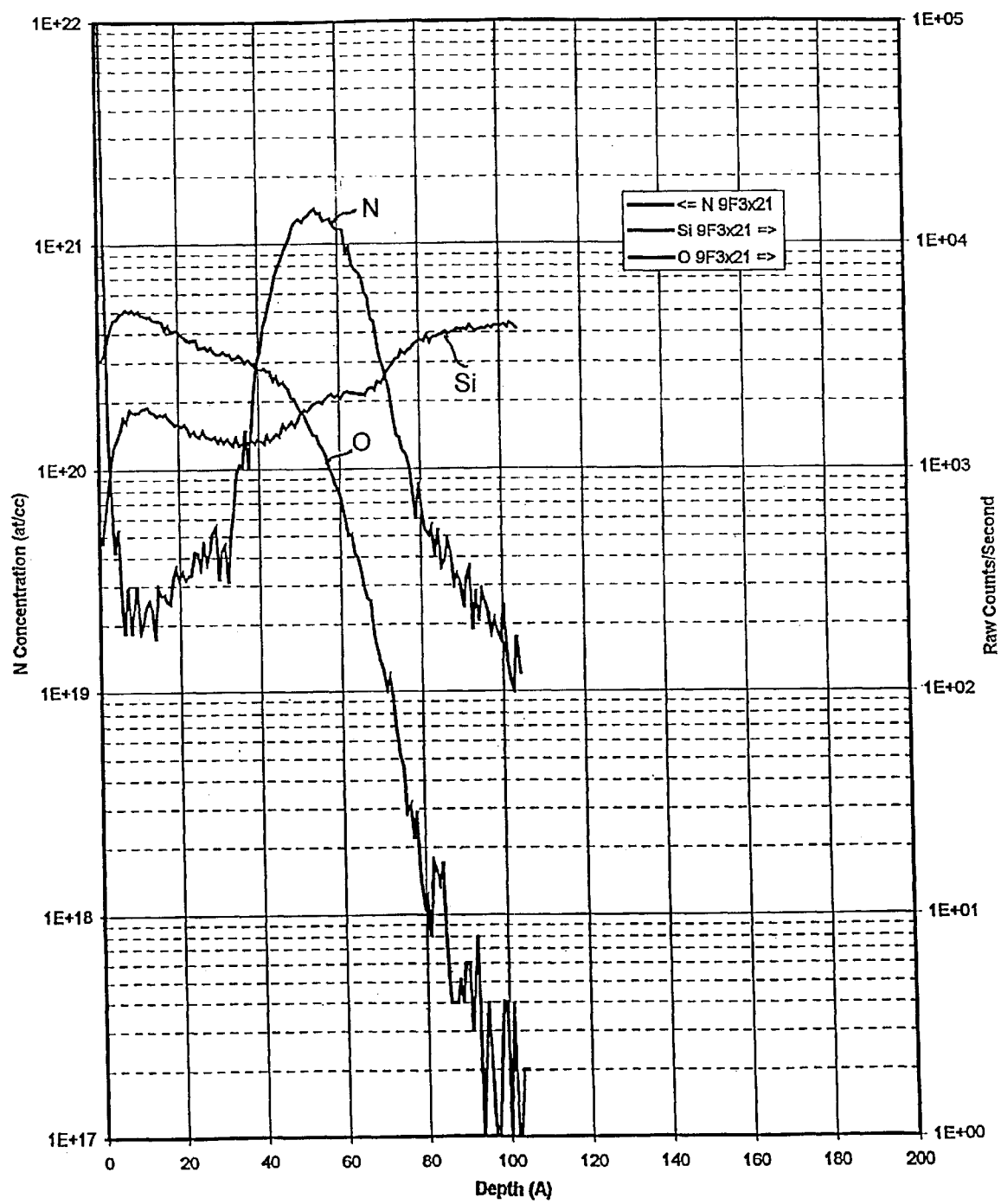
FIGS. 4A and 4B respectively illustrate the results of nitrogen implantation under normal energy levels and low energy levels.
Figure 4B:
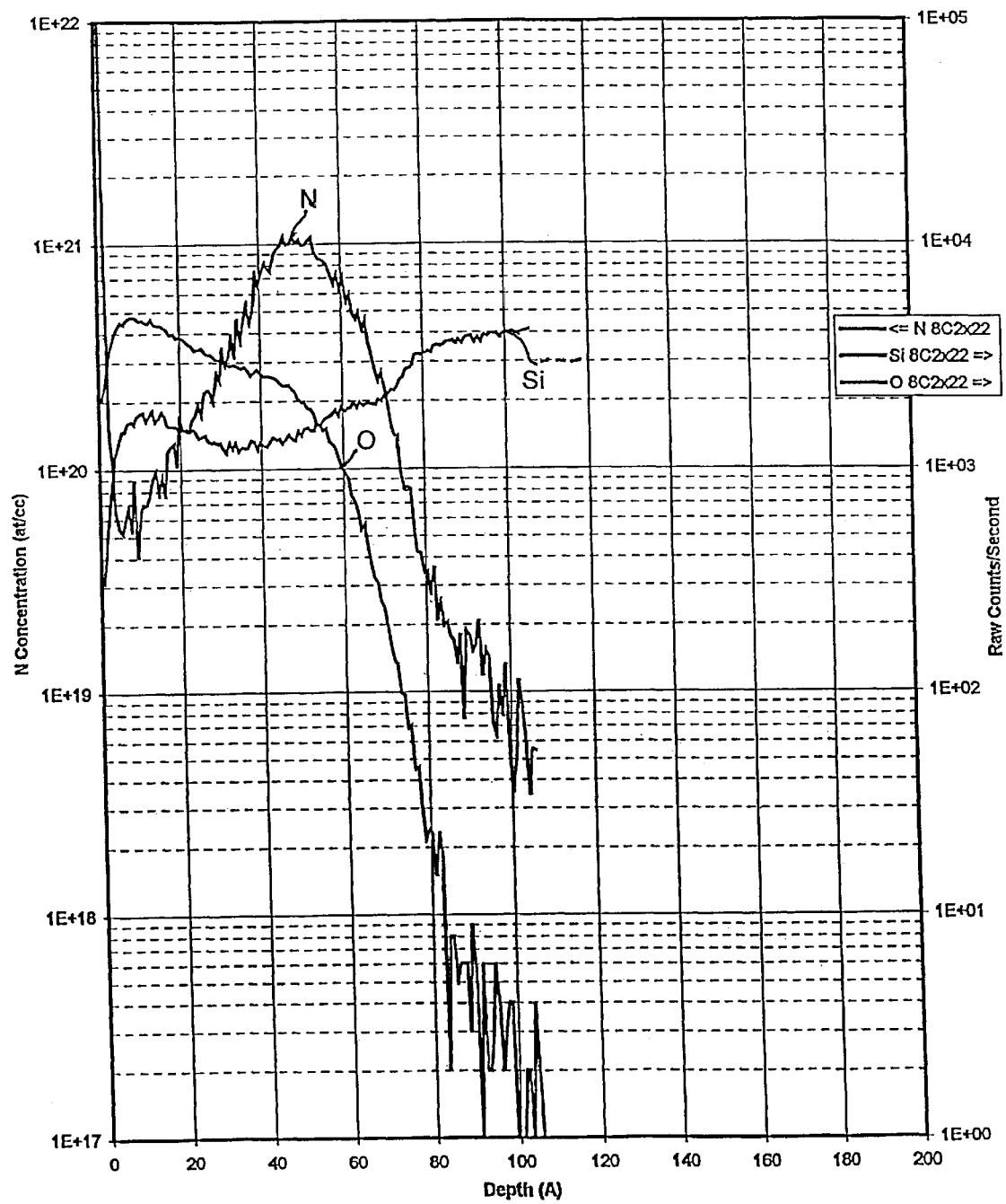

This point is illustrated in FIGS. 4A and 4B, which are graphs of actual experimental data that were collected after the nitrogen implantation step. FIG. 4A illustrates levels of nitrogen (N curve), silicon (Si curve), and oxygen (O curve) in the semiconductor structure after a nitrogen implantation step carried out under a normal energy level (15 keV). FIG. 4B illustrates levels of nitrogen (N curve), silicon (Si curve), and oxygen (O curve) in the semiconductor structure after a nitrogen implantation step carried out under a low energy level (2 keV). It can be seen from these graphs that the N curve of FIG. 4A peaks at a point in the semiconductor structure that is deeper than the Si curve-O curve crossover point while the N curve of FIG. 4B peaks at a point in the semiconductor structure that is shallower than the Si curve-O curve crossover point. It is understood that the Si curve-O curve crossover point is representative of the position of the Si/SiO$_2$ interface. Therefore, the experimental data graphed in FIGS. 4A and 4B illustrate that when nitrogen is implanted at a normal energy level, more nitrogen penetrates deeper than necessary, past the Si/SiO$_2$ interface into the semiconductor substrate to damage the semiconductor substrate, than when nitrogen is implanted at a low energy level.

Optionally, after the nitrogen implantation step, the top surface of the silicon oxide layer 120 may undergo RCA cleaning (wet chemical cleaning) to remove implant contamination. The RCA cleaning step is illustrated schematically in FIG. 3C.

The nitrogen implantation or RCA clean step is followed by heating in a furnace at a temperature of 800–1100° C. for 5–20 minutes. The heating may be carried out in a nitrogen or argon atmosphere (thermal annealing) or in an oxygen atmosphere (reoxidation). The heating step anneals out the implant damage and drives or diffuses the implanted nitrogen into the Si/SiO$_2$ interface 121 to form strong SiN bonds at the Si/SiO$_2$ interface 121. The strong SiN bonds is desirable because they improve the bonding strength at the Si/SiO$_2$ interface 121 of the resulting flash memory device. Further, some nitrogen remaining in the silicon oxide layer 120 increases the oxide bulk reliability, and protects the silicon oxide layer 120 against time-dependent dielectric breakdown.

Figure 3D:
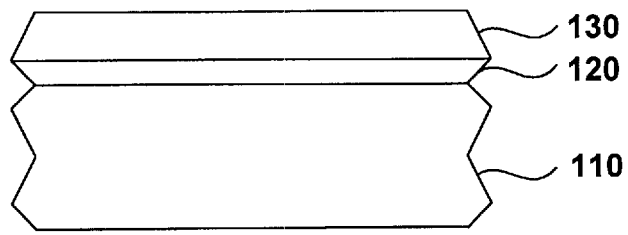
Figure 3E:
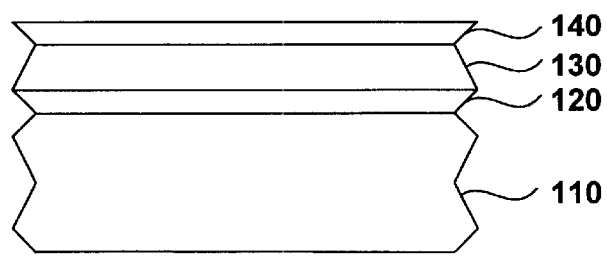

Subsequently, a silicon nitride layer 130 is deposited on top of the silicon oxide layer 120 by chemical vapor deposition (CVD) to a thickness of about 50–80 Å. FIG. 3D shows a silicon nitride layer 130 that has been deposited on top of the silicon oxide layer 120. A second layer of silicon oxide 140 is then formed on top of the silicon nitride layer 130 and the resulting structure is shown in FIG. 3E.

Figure 3F:
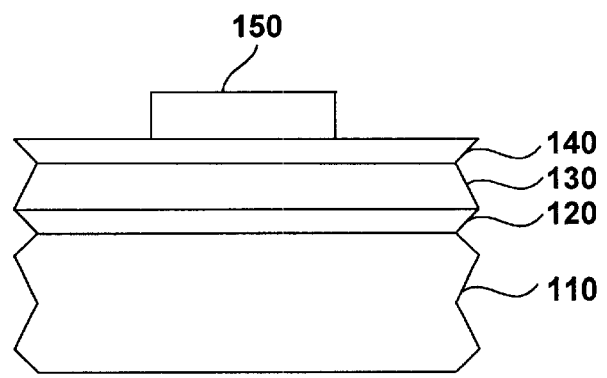
Figure 3G:
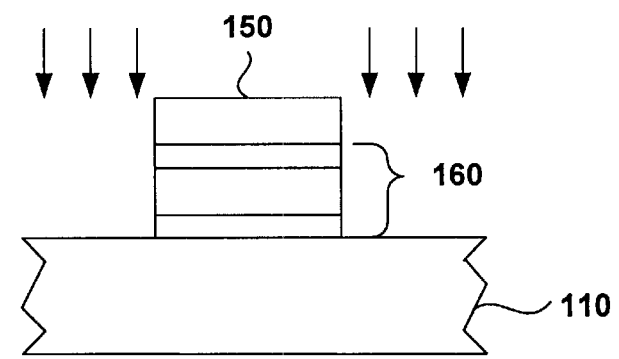

Thereafter, as shown in FIG. 3F, a photoresist 150 is formed on top of the second silicon oxide layer 140, and this semiconductor structure is etched until an upper surface of the silicon substrate 110 is exposed. The resulting structure, shown in FIG. 3G, is subsequently implanted with arsenic and boron ions using the remaining photoresist 150 as a mask and heated to diffuse the implanted ions.

Figure 3H:
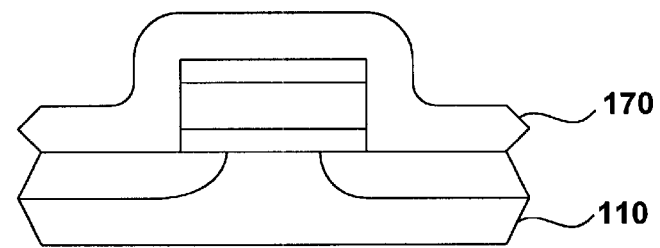
Figure 3I:
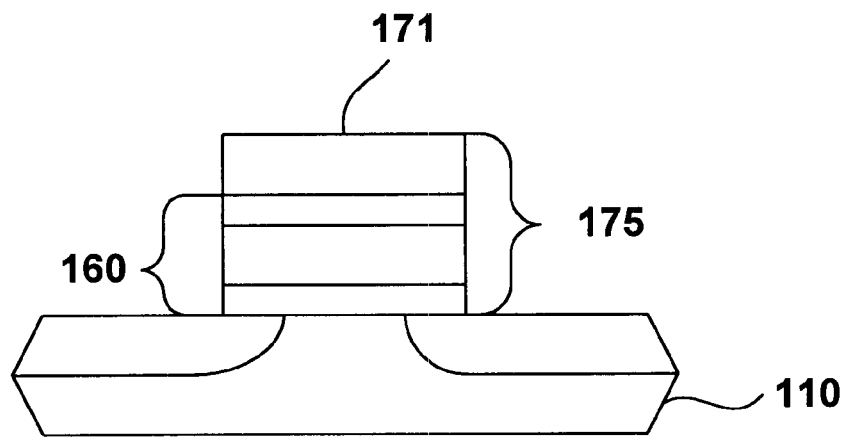
Figure 3J:
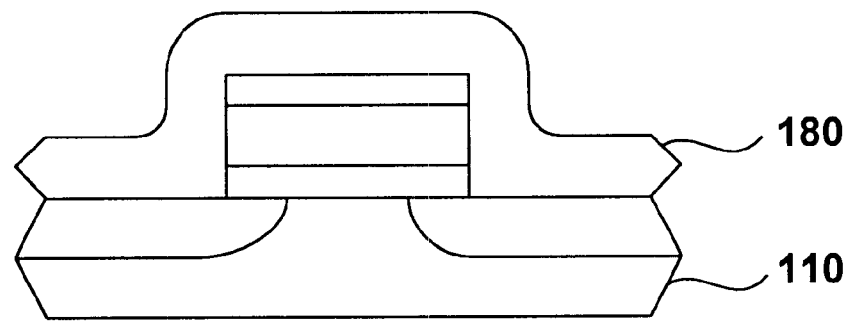

The remaining photoresist 150 is stripped away and, as shown in FIG. 3H, a polysilicon layer 170 is deposited on top of the exposed surface of the silicon substrate 110 and on top and sidewalls of the ONO layer 160. The polysilicon layer 170 is then patterned using conventional lithography techniques and a control gate 171 remains on top of the ONO layer 160. FIG. 3I shows the resulting gate structure 175 including the control gate 171 and the ONO layer 160.

Figure 3K:
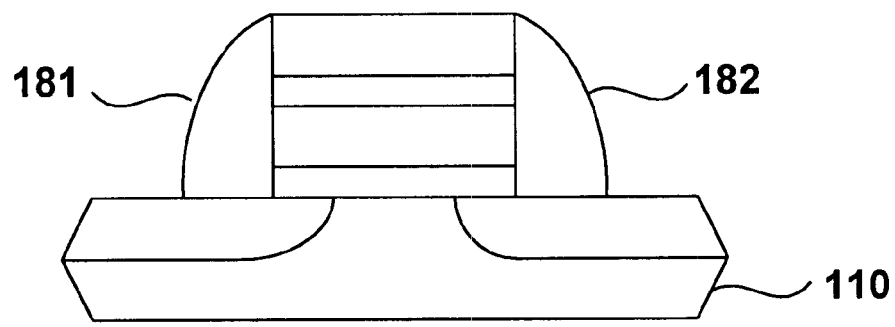

Oxide spacers 181, 182, shown in FIG. 3K, are formed on the sidewalls of the gate structure 175 by (i) depositing a conformal layer of silicon oxide by CVD on the exposed surface of the silicon substrate 110 and on top and sidewalls of the gate structure 175 (FIG. 3J), and (ii) anisotropically etching the deposited silicon oxide.

While particular embodiments according to the invention have been illustrated and described above, it will be clear that the invention can take a variety of forms and embodiments within the scope of the appended claims.

We claim:

1. In a flash memory device having an ONO layer that includes an upper layer of silicon oxide, a middle layer of silicon nitride, and a lower layer of silicon oxide, a method of forming the lower layer of silicon oxide on top of a semiconductor substrate, comprising the steps of:

heating the semiconductor substrate in an atmosphere containing oxygen to form a silicon oxide layer on top of the semiconductor substrate;

implanting nitrogen into the silicon oxide layer at less than normal energy levels; and heating the semiconductor substrate having the nitrogen-implanted silicon oxide layer thereon.

2. The method according to claim 1, wherein the step of implanting is performed at energy levels less than 10 keV.

3. The method according to claim 1, wherein the step of implanting is performed at energy levels less than about 4 keV.

4. The method according to claim 1, wherein the second step of heating is performed in an atmosphere containing an inert gas.

5. The method according to claim 4, wherein the second step of heating is performed in an atmosphere containing nitrogen.

6. The method according to claim 4, wherein the second step of heating is performed in an atmosphere containing argon.

7. The method according to claim 1, wherein the second step of heating is performed in an atmosphere containing oxygen.

8. The method according to claim 1, further comprising the step of RCA cleaning the silicon oxide layer.

9. A method of forming a gate structure for a flash memory device on top of a semiconductor substrate, comprising the steps of:

heating the semiconductor substrate in an atmosphere containing oxygen to form a first silicon oxide layer on top of the semiconductor substrate;

implanting nitrogen into the first silicon oxide layer at less than normal energy levels;

heating the semiconductor substrate having the nitrogen-implanted first silicon oxide layer thereon;

forming a nitride layer on top of the first oxide layer;

forming a second silicon oxide layer on top of the nitride layer;

selectively etching the nitrogen-implanted first silicon oxide layer, the silicon nitride layer, and the second silicon oxide layer to form an ONO structure; and forming a control gate on top of the ONO structure.

10. The method according to claim 9, wherein the step of implanting is performed at energy levels less than 10 keV.

11. The method according to claim 9, wherein the step of implanting is performed at energy levels less than about 4 keV.

12. The method according to claim 9, wherein the second step of heating is performed in an atmosphere containing an inert gas.

13. The method according to claim 12, wherein the second step of heating is performed in an atmosphere containing nitrogen.

14. The method according to claim 12, wherein the second step of heating is performed in an atmosphere containing argon.

15. The method according to claim 9, wherein the second step of heating is performed in an atmosphere containing oxygen.

16. The method according to claim 9, further comprising the step of RCA cleaning the silicon oxide layer.

* * * * *